United States Patent [19]

Ellis et al.

[11] Patent Number: 4,542,437
[45] Date of Patent: Sep. 17, 1985

[54] CATV PACKAGE DESIGNED FOR UNDERGROUND SYSTEM USE

[75] Inventors: William H. Ellis; Leo C. Wise, Jr., both of Jupiter, Fla.

[73] Assignee: Broadband Engineering, Inc., Jupiter, Fla.

[21] Appl. No.: 628,255

[22] Filed: Jul. 6, 1984

[51] Int. Cl.⁴ ............................................. H05K 7/20
[52] U.S. Cl. ..................... 361/386; 174/38; 339/17 LC; 361/395; 361/424
[58] Field of Search ............ 174/38, 35 R, 52 R; 339/17 C, 17 LC; 361/334, 356, 358, 360, 380, 386, 388, 390, 395, 399, 424, 427

[56] References Cited

U.S. PATENT DOCUMENTS

| | | | |
|---|---|---|---|
| 3,553,607 | 1/1971 | Lehrfeld | 339/17 LC |
| 3,812,381 | 5/1974 | Guyton | 339/17 LC |
| 3,934,177 | 1/1976 | Horbach | 361/399 |
| 3,951,490 | 4/1976 | Devendorf | 361/380 |
| 4,125,308 | 11/1978 | Schilling | 339/17 LC |
| 4,138,711 | 2/1979 | Bremenour | 361/424 |
| 4,218,578 | 8/1980 | Olschewski | 361/424 |
| 4,273,407 | 6/1981 | Snuffer | 339/17 LC |

*Primary Examiner*—G. P. Tolin
*Attorney, Agent, or Firm*—Weingarten, Schurgin Gagnebin & Hayes

[57] ABSTRACT

A CATV package housing electronic circuits designed especially for use in underground cable TV systems is vertically mounted with all connections on the bottom and includes a specialized electrically conductive T-plate that serves as a shield and heat sink positioned between two printed circuit boards to form an interior assembly. The T-plate includes a coaxial connector press fit through the plate to permit RF connection between the boards, with each board containing one or more right-angled coaxial connectors adapted to be inserted into mating connectors in the base of the unit when the circuit board/T-plate assembly is mounted to the base. The subject assembly is designed to be mounted in a small enclosure that may be mounted underground in an underground vault or within an enclosure flush with the ground.

13 Claims, 6 Drawing Figures

CATV PACKAGE DESIGNED FOR UNDERGROUND SYSTEM USE

FIELD OF THE INVENTION

This invention relates to the packaging of electronic equipment for utilization in CATV systems and more particularly to the packaging and shielding of electronic circuits for use in underground vaults.

BACKGROUND OF THE INVENTION

Normally standard aerial CATV amplifiers are utilized for underground system applications. Because these amplifiers are intended for aerial use, their input and output connectors are on opposite ends of the amplifier and are therefore not well suited for underground applications where all cables, both input and output, come from the same direction. To alleviate this problem especially for underground mounted configurations, special 180° connectors are used on the output side of the amplifier. Thus all input and output terminals are made to face in the same direction. However, these connectors are both expensive and difficult to install.

Using aerial amplifers underground also presents a space problem since no attempt is made to keep them relatively small. As a result, large enclosures are needed which are expensive and more difficult to install, thereby increasing installation costs. Moreover, for under the surface mounting, there is at present no way to waterproof the aerial housing configuration adequately and when the vault floods, the amplifier is covered with water. The amplifier itself is waterpoof so that no water usually enters the housing, but the case itself is usually made of aluminum which corrodes easily.

SUMMARY OF THE INVENTION

In contradistinction to the CATV cannisters which are utilized above ground in aerial configurations and which have outputs at opposite ends of a rectangular shaped container, the subject package is provided with input and output connectors on the same end of the package. The package is designed in a vertical rather than a horizontal configuration. Moreover, the package is designed so that it may be mounted in another enclosure that may be waterproofed so that it can be operated in a flooded underground vault. In one embodiment, the package is cylindrical rather than rectangular so as to be able to fit into a cylindrical enclosure.

The CATV package housing electronic circuits is designed especially for use in underground cable TV systems and is used to house low distortion trunk amplifiers, single output intermediate bridgers, dual output intermediate bridgers, low distortion intermediate bridges, line extenders, and low distortion line extenders.

The vertical mounting is a specialized feature of this invention, as is a specialized electrically and thermally conductive T-plate that serves as a shield and heat sink positioned between two printed circuit boards to form an interior assembly. In one embodiment, the circuit boards are spaced from the T-plate with standoffs. In another embodiment, the T-plate includes a press fit coaxial connector to permit RF connection between the boards, with the bottom of each board containing one or more right-angled coaxial connectors adapted to be inserted into mating connectors in the base of the unit when the circuit board/T-plate assembly is mounted to the base. Alternatively, only one printed circuit board need be provided.

The T-plate serves as an RF electrical shield and also as a heat sink for the circuits. Otherwise, there would be undesired feedback from output to input which could cause instability in amplifiers used. The heat sink is primarily used to remove heat from the power amplifier which has a base extension which contacts the T-plate. Its T configurations derives from the fact that it consists of a vertically oriented plate which is attached to a horizontally-running base plate, such that in cross-section the structure resembles an inverted T. The base plate is provided with a number of oversized apertures to permit portions of the right-angled coaxial connectors to pass through where they mate with coaxial connectors in the base of the unit. As will be discussed, the oversizing permits ready circuit board removal.

The subject assembly is designed to be mounted in a small enclosure that may be mounted underground in an underground vault or within the base of an enclosure flush with the ground.

The above package has the following advantages over the approaches normally used. First, since input and output terminals are provided at the same end, 180° RF connectors are not required. Secondly, the entire circuit board can be readily removed and replaced without removing the coaxial connectors from respective circuit boards. Further, the package can be waterproofed so that it will operate in a flooded vault without fear of corrosion.

Additionally, the package is much smaller than those associated with aerial amplifiers intended for the same usage. As a result, a much smaller underground enclosure is needed which results in installation cost savings.

The vertical mounted package with the input/output terminals on one end may house a manual trunk amplifier, a line extender, an intermediate one output bridge amplifier, an intermediate two output bridge amplifier with single output hybrid, intermediate two output bridger amplifiers will separate hybrids for each output, low distortion manual trunk amplifiers utilizing parallel output hybrids, low distortion line extenders using parallel output hybrids, low distortion one output bridger amplifiers utilizing parallel output hybrids, and an AGC (automatic gain control) or AGC/ASC (automatic slope control) trunk amplifier. Additionally aerial mounted versions of the subject package are useful when access to only one end of the aerial unit is possible.

The above units may be utilized for CATV, MATV (master antenna television), and SMATV (satellite master antenna television) underground distribution systems as well as local area network underground distribution systems. Any broadband underground distribution system utilizing the frequency range designed into the unit, in one embodiment 50–450 megahertz in the forward direction and 5–30 megahertz in the reverse direction, can readily utilize the subject vertically mounted and encased units. Moreover, it is possible to provide different frequency splits within the 5–450 megahertz band.

BRIEF DESCRIPTION OF THE DRAWINGS

These noted feures of the subject invention will be better understood in connection with the detailed description taken in conjunction with the drawings of which.

DETAILED DESCRIPTION

Figure 1:
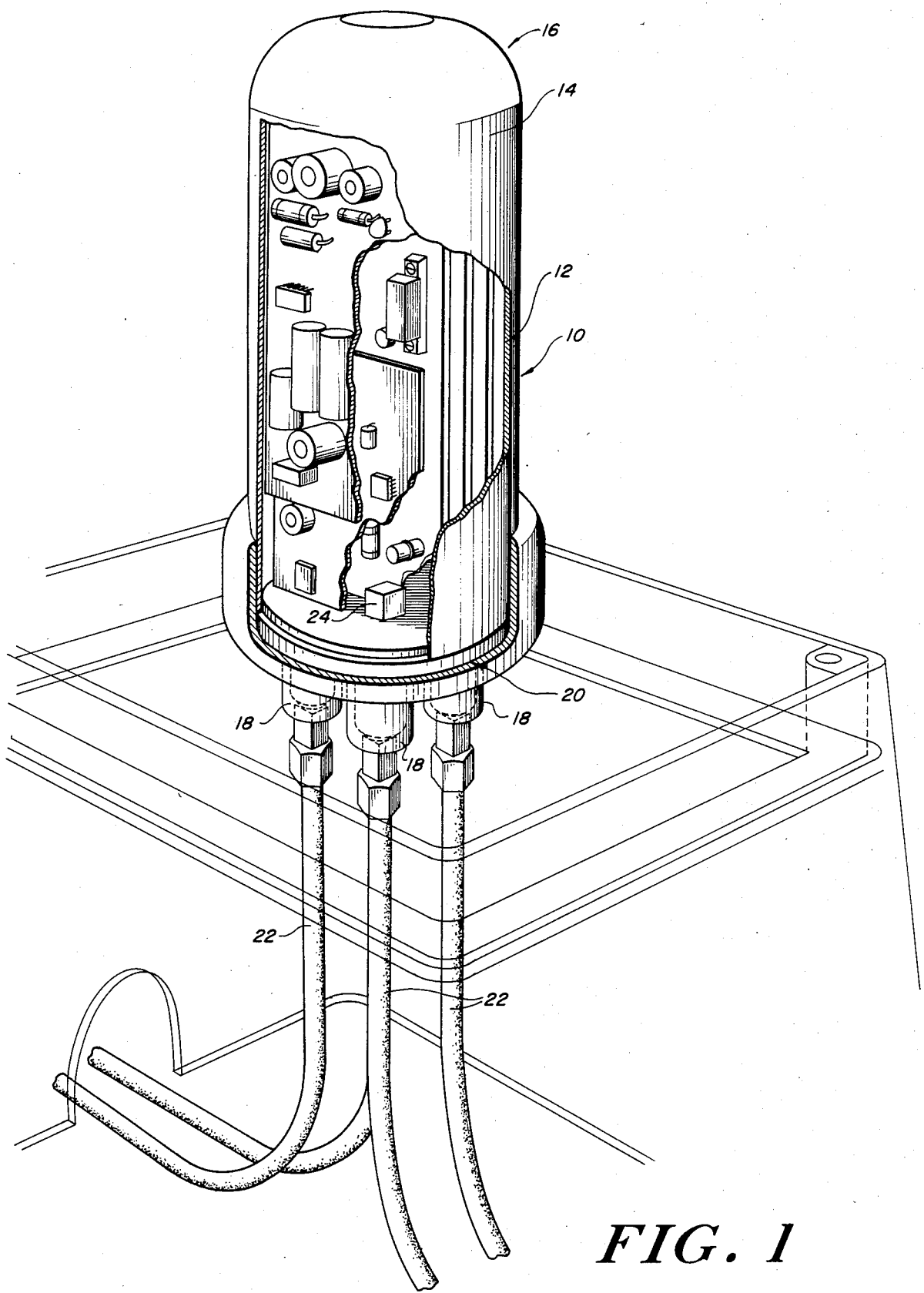
FIG. 1 is an isometric view of the subject package with a portion of the outer shell cut away to indicate the components contained therein.

Referring now to FIG. 1 the subject package 10 is shown in partial cut away to indicate that circuit board and shield assemblies 12 are packaged within a cannister 14 which in a preferred embodiment is cylindrical. Cannister 14 is mounted within an outer cannister generally indicated by reference character 16 to which it may be sealed. Various coaxial cable connections are made by connectors 18 at the base 20 of the package such that all coaxial cables as illustrated by reference character 22 enter from the bottom of the package. RF connection is made to the printed circuit boards within the package via right-angled coaxial connectors 24 mounted to the printed circuit boards, with portions of the right-angled coaxial connectors passing through a portion of the T-plate to be described and into upwardly extending coaxial connectors carried by base 20.

Figure 2:
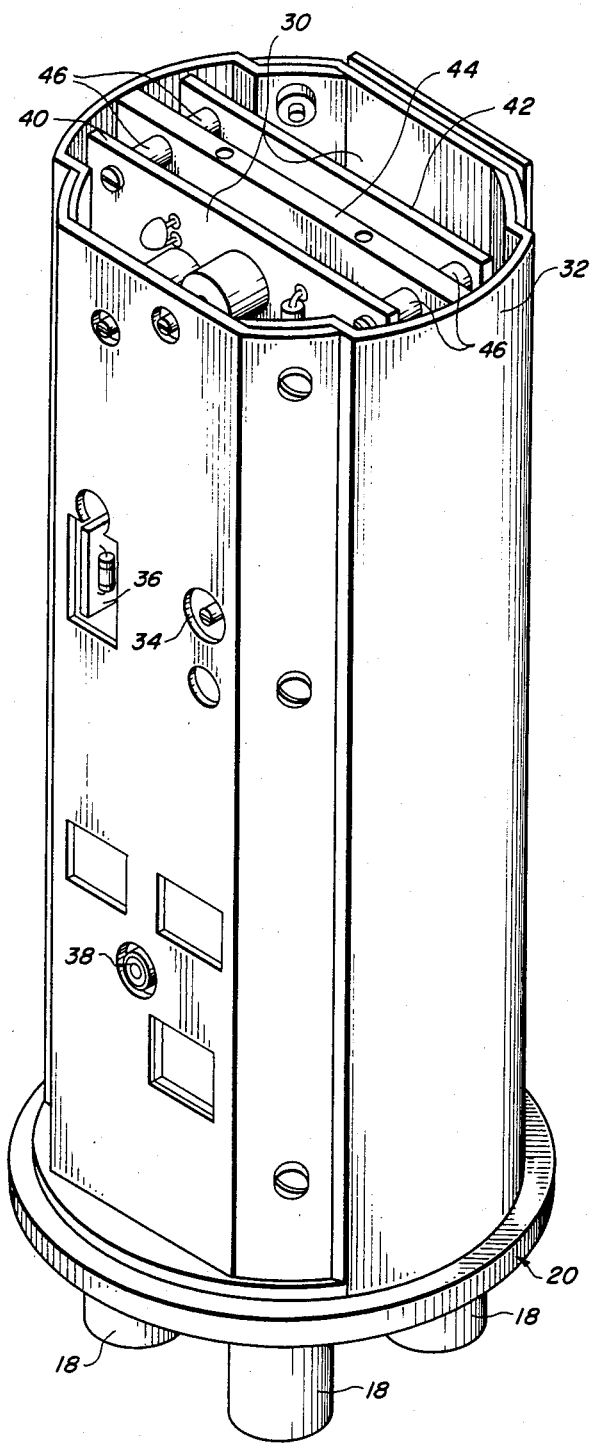
FIG. 2 is a diagrammatic representation of the subject package with its outer shell removed illustrating from the top the position of the T-plate and the spaced-apart circuit boards on either side thereof.

Referring to FIG. 2, an internal assembly illustrated by bracket 30 is mounted on base 20 and is provided with external shield 32 which is bolted together and which surrounds the internal assembly, with various apertures 34, 36, and 38 being formed in the external shield to provide access to, for instance, trimming capacitors or potentiometers mounted to the printed circuit boards within assembly 30.

These printed circuit boards, here illustrated by reference characters 40 and 42, are mounted to an electrically and thermally conductive T-plate 44 via standoffs 46 which are premounted to the T-plate.

Figure 3:
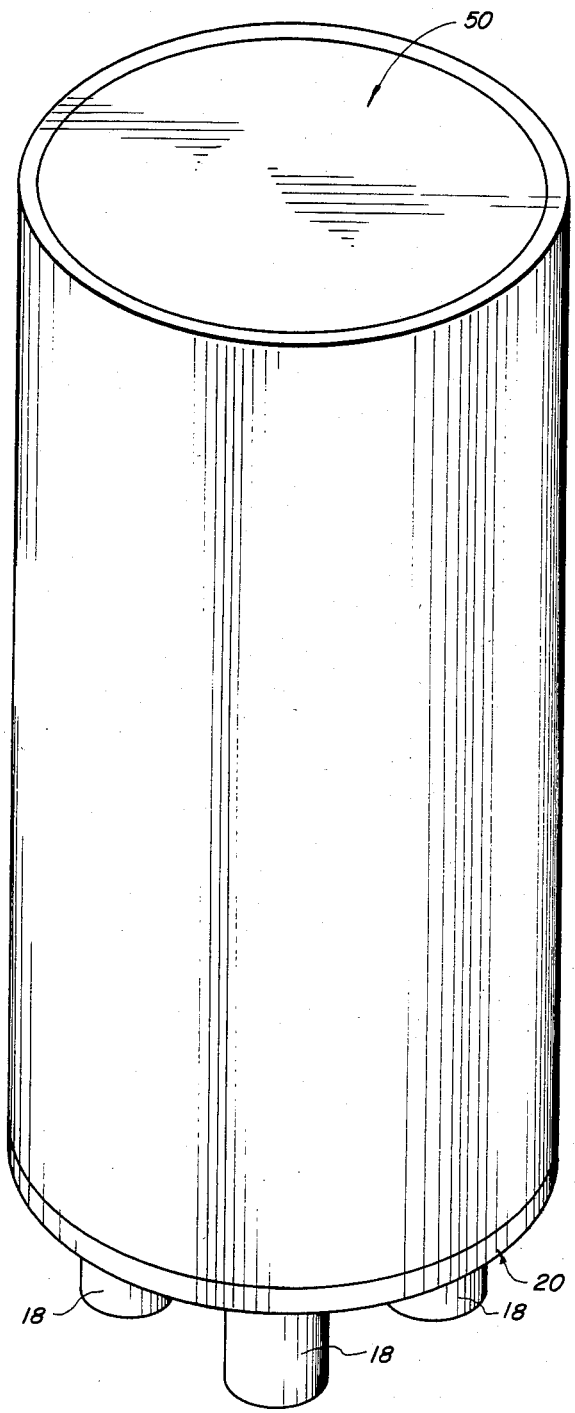
FIG. 3 is a diagrammatic representation of the completed package with outer cover thereon.

Referring to FIG. 3, an inner cannister generally designated by reference character 50 fits over the surrounding shield 32 and is positioned over base 20 of the package to complete an unencapsulated version of the subject invention.

Figure 4:
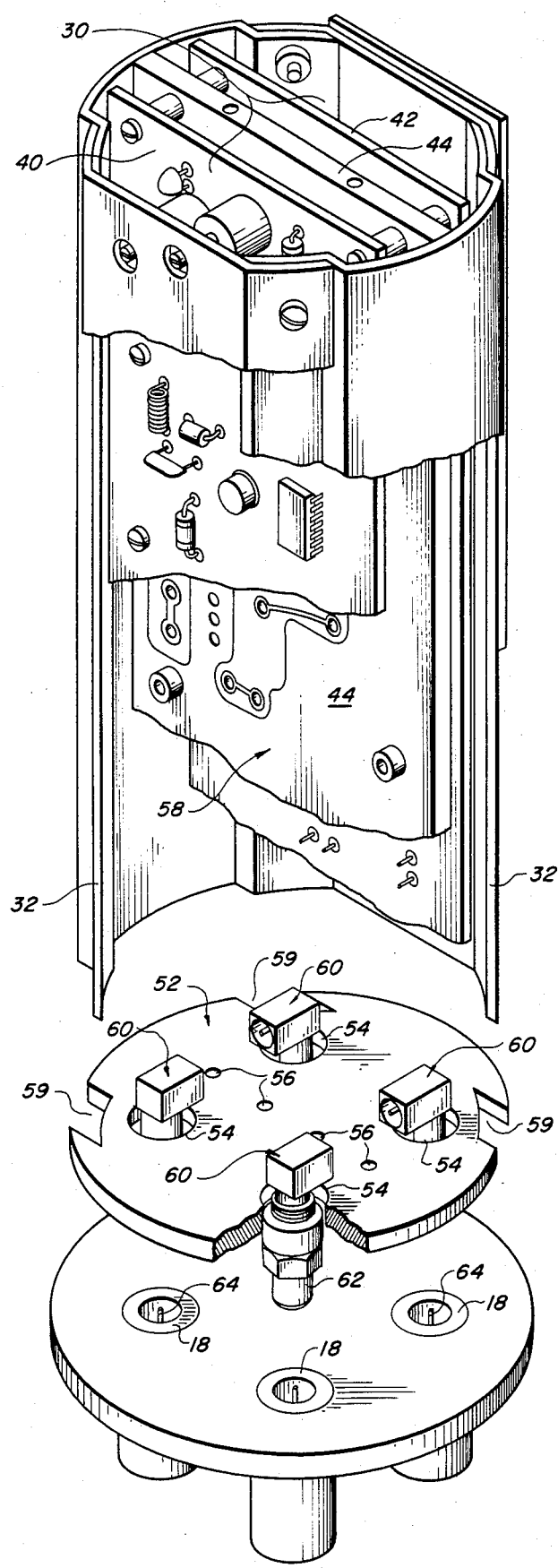
FIG. 4 is a partially exploded and cut away illustration of the package of FIG. 2 illustrating the bottom plate, the right-angled coaxial connectors which are previously attached to the printed circuit boards as well as the placement of the printed circuit boards astride the T-plate.

Referring now to FIG. 4, it can be seen that printed circuit boards 40 and 42 are spaced from T-plate 44, with the bottom portion of the T-plate being formed by a base portion 52 in the form of a disc which has oversized apertures 54 therein. The disc is mounted to a verticle T-plate portion 58 of the T-plate via bolts which extend through apertures 56 such that in cross-section the shield and heat sink consist of the vertically oriented T-plate portion 58 and the orthogonally oriented base portion 52. It will be appreciated that locating slots 59 are provided in base portion 52 to provide adequate clearance for the side shield.

Also shown in this figure are the right-angled coaxial connectors, here designated by reference characters 60 which are mounted to the printed circuit boards prior to the mounting of base portion 52 to plate portion 58.

In one embodiment, each of these right-angled coaxial connectors have female end portions 62 which extend downwardly through oversized apertures 54 to mate with upstanding male connector portions 64 of coaxial connectors 18. The reason for the oversizing is to provide assembly clearance and to permit removal of a defective circuit board from the T-plate by merely unscrewing the circuit board and pulling up the board with the right-angle connector such that the connector unmates and comes up through the oversized aperture.

Figure 5:
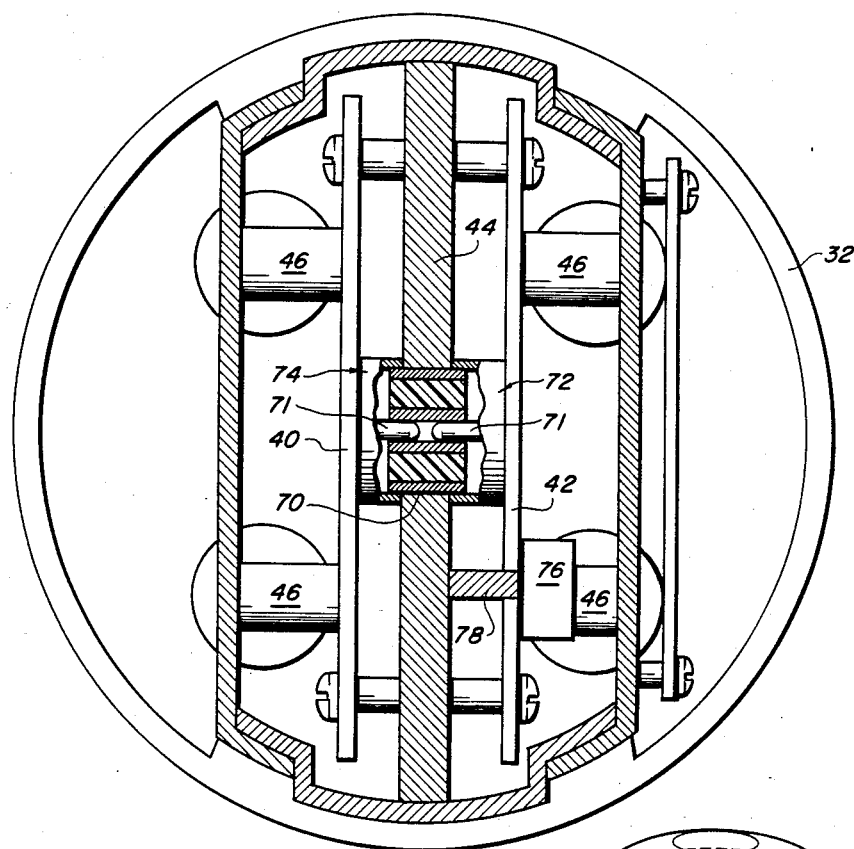
FIG. 5 is a cross-sectional view of a portion of the interior assembly of the subject package illustrating the RF connection between the two opposed printed circuit boards through the T-plate.

Referring to FIG. 5, in one embodiment T-plate 44 is provided with a female coaxial connector 70 press fit therethrough which is adapted to receive the male portions 71 of coaxial connectors 72 and 74 which are mounted respectively to circuit boards 42 and 40. This provides for RF interconnection between the circuit boards, should such be desired.

One of the main purposes of T-plate 44 is to provide a heat sink for any power amplifier or semiconductor device utilized. Here, an amplifier 76 is mounted to printed circuit board 42, with the amplifier having a base extension 78 which is highly thermally conductive and which passes through circuit board 42 to contact T-plate 44 so that amplifier-generated heat is dissipated.

Figure 6:
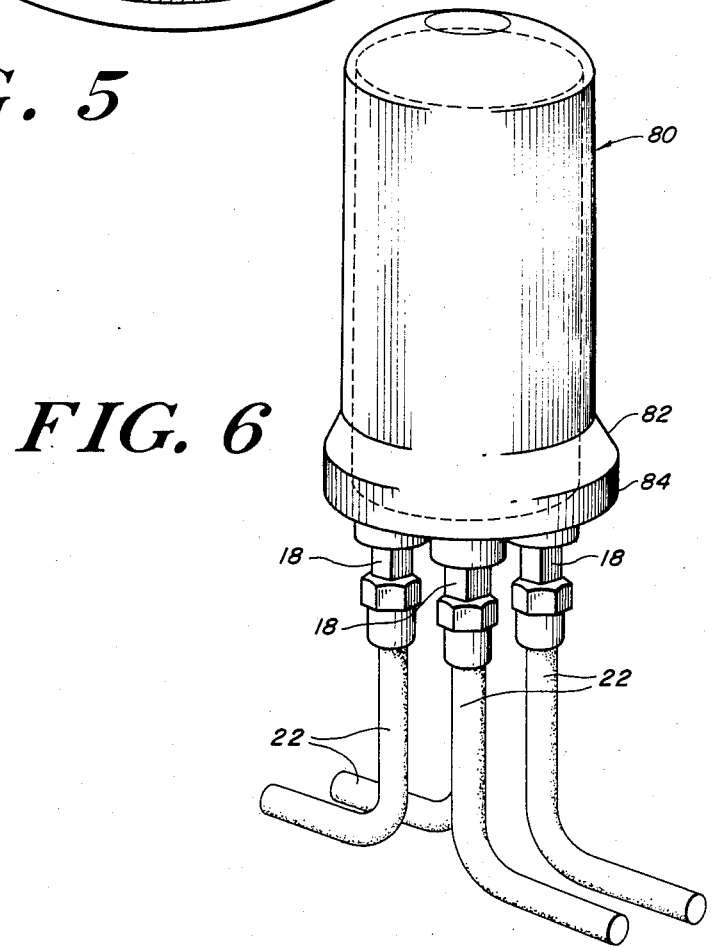
FIG. 6 is a diagrammatic illustration of the encasement of the subject package in a coaxially-mounted cylindrical outer cannister.

Referring now to FIG. 6, the entire assembly of FIGS. 3 or 4 may be mounted within an outer cylindrical container 80 as illustrated which may carry a flanged portion 82 and an expanded base portion 84 as illustrated. Coaxial connectors 18 extend from the base of this structure such that coaxial cables 22 may be easily attached from one side.

In the manufacturing process, in one embodiment, the first step is to make up the printed circuit boards with male coaxial connectors located at the appropriate portions on the boards and with right-angled coaxial connectors at the base of the board. Secondly, the flat plate portion of the T-plate has press fit therein a double-ended female coaxial connector at a location adapted to receive the male connectors from the opposing circuit boards. Thereafter, the opposing circuit boards are screwed or secured to opposite sides of the T-plate and are separated from the T-plate by suitable standoffs. The next step is to screw or otherwise affix the bottom portion of the T-plate to the upstanding portion while positioning it such that portions of the right-angled coaxial connectors project through the aforementioned oversized holes. Thereafter, the assembly formed thus far is positioned over the base having the upstanding male coaxial connectors and the right-angled coaxial connectors are secured to these upstanding male connectors. At this point, a cover or cannister and/or a power supply package may be affixed to the assembly and an outer cover or cannister placed over the entire assembly.

Having above indicated a preferred embodiment of the present invention, it will occur to those skilled in the art that modification and alternatives can be practiced within the spirit of the invention. It is accordingly intended to define the scope of the invention only as indicated in the following claims.

What is claimed is:

1. An electrical component package comprising:

a T-plate including a vertically oriented first member and an orthogonal second member positioned proximate the bottom thereof;

a printed circuit board mounted to one side of said vertically oriented first member of said T-plate to produce an interior assembly, said printed circuit board having a right-angled coaxial connector at the bottom thereof extending through the second member of said T-plate;

a base having a top surface and at least one mating coaxial connector extending therethrough, with one portion of said mating connector exposed at the top surface of said base and receiving a mating portion of said right-angled connector, said base being secured to said T-plate such that said coaxial connectors mate; and a cover over said interior assembly and said base to provide a vertically oriented package with a coaxial connector extending from said base.

2. The package of claim 1 wherein said interior assembly includes a shield surrounding said assembly.

3. The package of claim 1 and further including a second printed circuit board mounted to the other side of said vertically oriented first member of said T-plate and a coaxial connector therethrough, said printed circuit boards having inwardly directed coaxial connectors which mate with said T-plate carried coaxial connector.

4. The package of claim 1 and further including means spacing said printed circuit board from said first member of said T-plate.

5. The package of claim 1 and further including a coaxially oriented outer cover over said first-mentioned cover.

6. The package of claim 1 wherein said circuit board includes a semiconductor device having a thermally conductive base extension which passes through said circuit board and contacts said first member of said T-plate.

7. An electrical component package for use in underground cable network applications comprising:

a T-plate having a vertically oriented flat upstanding portion and an orthogonally oriented base plate portion having a number of apertures therein;

a pair of printed circuit boards mounted to either side of the upstanding portion of said T-plate to produce an interior assembly, said printed circuit boards having a number of right-angled coaxial connectors at the bottom thereof extending through corresponding apertures in the base plate portion of said T-plate;

a base having a top surface and a corresponding number of mating coaxial connectors extending therethrough, with one portion of each mating connector exosed at the top surface of said base and receiving a mating portion of a corresponding right-angled connector, said base being secured to said T-plate such that said coaxial connectors mate; and a cover over said interior assembly and said base to provide a vertically oriented package with a number of coaxial connectors extending from only one end of said package.

8. The package of claim 7 wherein said interior assembly includes a shield surrounding said assembly.

9. The package of claim 7 and further including a coaxial connector through the up-standing portion of said T-plate, said printed circuit boards having inwardly directed coaxial connectors which mate with said T-plate carried coaxial connector.

10. The package of claim 7 and further including means spacing said printed circuit boards from said T-plate.

11. The package of claim 7 and further including a coaxially oriented outer cover over said first-mentioned cover.

12. The package of claim 7 wherein one of said circuit boards includes a semiconductor device having a thermally conductive base extension which passes through said circuit board and contacts said upstanding portion of said T-plate.

13. The package of claim 7 wherein said apertures are oversized to permit disassembly of said circuit boards.

* * * * *